(12) United States Patent
Inaoka

(10) Patent No.: US 6,878,446 B2
(45) Date of Patent: Apr. 12, 2005

(54) SEMICONDUCTOR NANOPARTICLES COATED WITH ELECTROACTIVE POLYMERS

(75) Inventor: Seiji Inaoka, Campbell, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 26 days.

(21) Appl. No.: 10/406,945

(22) Filed: Apr. 3, 2003

(65) Prior Publication Data

US 2004/0197560 A1 Oct. 7, 2004

(51) Int. Cl.[7] .................................................. B32B 5/16
(52) U.S. Cl. .................... 428/407; 427/214; 427/215; 427/220; 427/221; 427/301; 427/407.1; 977/DIG. 1
(58) Field of Search .............................. 427/214, 215, 427/220, 221, 407.1; 428/407

(56) References Cited

U.S. PATENT DOCUMENTS

| | | | | |
|---|---|---|---|---|
| 5,225,495 A | * | 7/1993 | Han et al. | 525/327.4 |
| 5,536,573 A | * | 7/1996 | Rubner et al. | 428/378 |
| 5,830,539 A | * | 11/1998 | Yan et al. | 427/551 |
| 6,312,809 B1 | * | 11/2001 | Crooks et al. | 428/411.1 |
| 6,391,509 B1 | * | 5/2002 | Drappel et al. | 430/111.35 |
| 6,710,366 B1 | * | 3/2004 | Lee et al. | 257/14 |
| 6,803,097 B2 | * | 10/2004 | Roitman et al. | 428/327 |

OTHER PUBLICATIONS

Furbeth et al, "Novel protective coatings for steel based on a combination of self–assembled monolayers and conducting polymers", (2002).*
Martin et al, "Surface Structures of 4–Chlorocatechol Absorbed on Titanium Dioxide", Environ. Sci. Technol., 1996, 30, 2535–2542.*

* cited by examiner

Primary Examiner—H. Thi Le

(57) ABSTRACT

A method for coating particles and the coated particles obtained thereby are disclosed. The particles are first placed in a solution of a first monomer that forms a self-assembling monolayer on the particles thereby forming coated particles. The coated particles are then suspended in a second solution that includes a chemical species and an initiator for oxidative polymerization. The chemical species has a higher oxidation potential than the monomers. In addition, the chemical species form a homopolymer in the presence of the initiator that is covalently bound to the first monomers. Particles of semiconductors such as $TiO_2$, $SiO_2$, $SnO_2$, $Al_2O_3$ can be coated with polymers that alter the bandgap energy of the semiconducting particles and/or provide other useful surface chemistries.

12 Claims, 1 Drawing Sheet

SEMICONDUCTOR NANOPARTICLES COATED WITH ELECTROACTIVE POLYMERS

FIELD OF THE INVENTION

The present invention relates to semiconducting particles having photoactive characteristics.

BACKGROUND OF THE INVENTION

Presently, photoactive semiconductor nanoparticles are potentially useful in constructing solar cells and for use as labels in various bioassays. Particles of titanium dioxide ($TiO_2$) are attractive candidates for such applications. However, the band gap energy of undoped $TiO_2$, which is ~3.2 eV, prevents such undoped particles from being used in a number of applications. Accordingly, various schemes for reducing the band gap energy of such particles have been suggested. For example, in one application, particles of a titanium oxide are mixed with the monomer for conjugated polymer, then the monomer is polymerized with added oxidant. The composite particles of inorganic metal oxides and electroactive polymers have potential uses in photovoltaic cells. Unfortunately, the amount of polymer that is attached to the particles depends on a number of factors that are not easily controlled.

A second method for preparing coated nanoparticles is taught in Rajh, et al (*J. Phys. Chem. B*. 1999, 103, 3515). Rajh teaches a method for reducing the band gap energy of $TiO_2$ particles by sensitizing colloidal $TiO_2$ nanoparticles with organic molecules such as dopamine and ascorbic acid. The organic molecules in question have adjacent hydroxide units on an aromatic ring that open the Ti=O double bonds that exist on the surface of the colloidal nanoparticles. While the coupling of colloidal $TiO_2$ with specific organic molecules is very simple, the stability of such bonds is limited. In addition, this coupling relies on the existence of Ti=O bonds. These bonds are associated with "crystal defects" on the surface of the particles, and hence, the density of these bonds is low. Furthermore, the density of these bonds is a function of particle size, which further limits the applicability of this procedure.

Yet another method for modifying the surface of $TiO_2$ particles utilizes sensitizer molecules. For example: Tachibana, et al (*J. Phys. Chem. B* 2000, 104, 1198) teach a method in which the sensitizer molecules are simply absorbed on the surface of the $TiO_2$ particles. Unfortunately, only a limited number of sensitizer molecules can be so absorbed on the surface of the $TiO_2$ particles, and hence, this technique has a sensitization yield that is insufficient for many applications.

SUMMARY OF THE INVENTION

The present invention includes a method for coating particles and the coated particles obtained thereby. The particles are first placed in a solution of a first monomer that forms a self-assembling monolayer on the particles thereby forming coated particles. The coated particles are then suspended in a second solution that includes a chemical species and an initiator for oxidative polymerization. The chemical species has a higher oxidation potential than the monomers. In addition, the chemical species form a homopolymer in the presence of the initiator that is covalently bound to the first monomers. Particles of semiconductors such as $TiO_2$, $SiO_2$, $SnO_2$, $Al_2O_3$ can be coated with polymers that alter the bandgap energy of the semiconducting particles and/or provide other useful surface chemistries.

DETAILED DESCRIPTION OF THE PREFERRED EMBODIMENTS OF THE INVENTION

The present invention includes a method for modifying the surface of a metal oxide particle in a manner that will allow other organic molecules to be incorporated on the surface of the particle with greater density and better stability than the methods described above. The manner in which the present invention provides its advantages can be more easily understood with reference to an exemplary coated $TiO_2$ particle that is prepared by the method of the present invention. Modification of $TiO_2$ particles with polymers that are more hydrophobic than $TiO_2$ enables particles to be stably dispersed in organic solvents. For example, $TiO_2$ particles modified with poly(3,4 dioxyethylenethiophene) (PEDOT) can be dispersed in methanol and acetonitrile for over 2 weeks. Such modified particles can be selectively deposited to form a $TiO_2$-polymer matrix on the surface of an electrode and will be electroactive because of the conjugated PEDOT polymer molecules.

Figure 2:
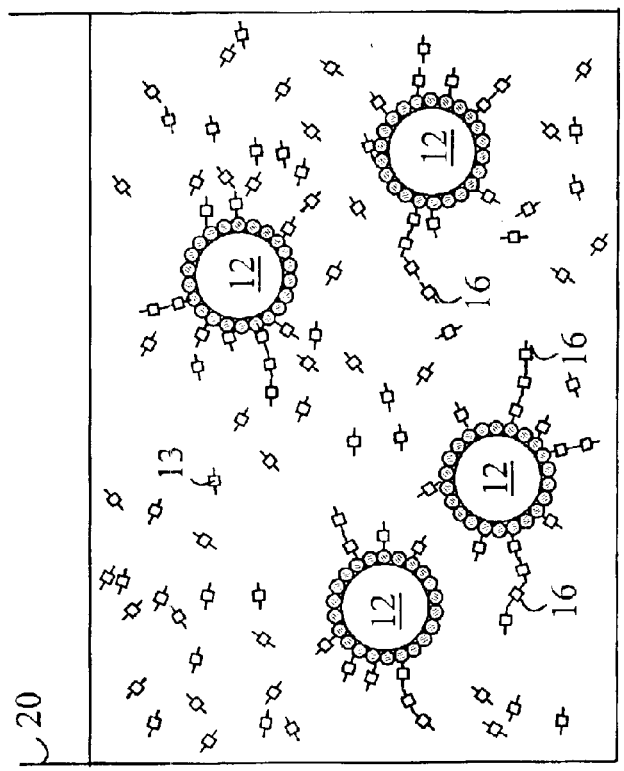
FIGS. 1–2 illustrate the modifications that occur in the particles at different stages in the method of the present invention.
Figure 1:
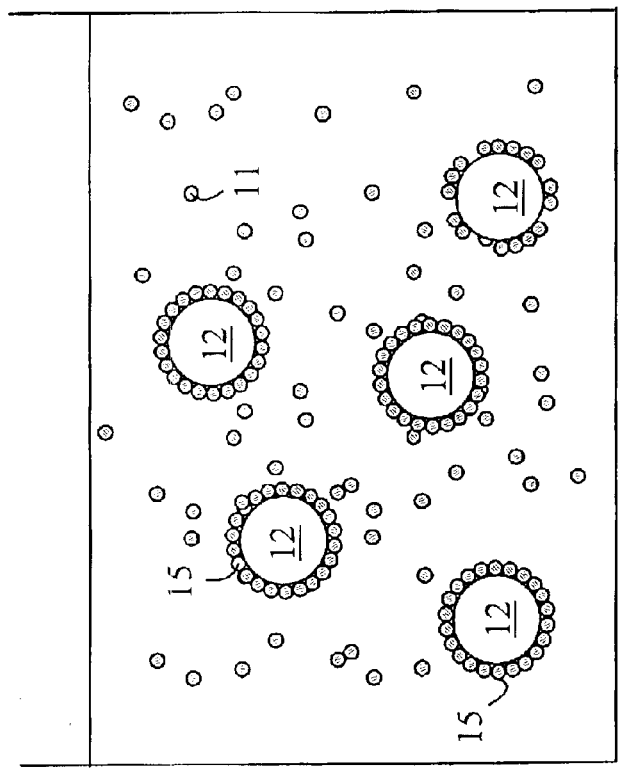

The manner in which a suspension of particles is modified in the method of the present invention can be more easily understood with reference to FIGS. 1–2, which illustrate the modifications that occur in the particles at different stages in the method. The present invention makes use of two species of monomers. The first species 11 forms a self-assembling monolayer 15 around the particles 12 as shown in FIG. 1. In general, this monolayer is not covalently bound to the surface of the particle. Once the monolayer has formed, any excess molecules of the first species are removed, and the second molecular species 13 is introduced into the reaction vessel 20 as shown in FIG. 2.

The second molecular species has two properties. First, the second molecular species are the monomers for a polymerization reaction, which forms a homopolymer of the second species molecules by an oxidative polymerization process. Second, the second molecular species will covalently bond to the first molecular species more readily than with the other molecules of the second species. That is, the first molecular species is more easily oxidized than the second molecular species. Hence, when a polymerization initiator is introduced into the reaction vessel, the molecules of the second molecular species are first linked covalently to the molecules of the first molecular species in monolayer 15. As a result of this covalent binding, the oxidative potential for the polymerization of additional molecules of the second molecular species to those attached to the monolayer is reduced. Hence, the second species will polymerize forming chains 16 that are attached to the monolayer. These chains eventually form an encapsulating layer around the particle. If the second molecular species has multiple polymerization sites, the chains will become cross-linked and the encapsulating layer will be a two-dimensional matrix.

In a first example, $TiO_2$ particles are modified to provide an encapsulating layer of poly(3,4 dioxyethylenethiophene). The $TiO_2$ particles are dispersed in ethanol (95%) and trimethoxysilyethylpyrrole (silane) is added to the dispersion in excess. After the silane has had sufficient time to form a self-assembled monolayer on the particles, the excess silane is washed out. The modified particles are then mixed with 3,4 dioxyethylenethiophene (EDOT) and an emulsifier such as sodium dodecyl sulfate (SDS). An initiator for oxidative polymerization, such as ammonium persulfate, is added and the mixture is stirred for approximately 20 hours. The polymerization reaction results in PEDOT being formed on the surface of the particles. Any small molecules such as a residual initiator and SDS are then removed using dialysis tubing with cutout MW of 12000–14000 Dalton. The modified particles obtained in this manner can be dispersed in an organic solvent.

In another exemplary embodiment of the present invention, catechol $(1,2-(OH)_2-C_6H_4)$ is used as the first molecular species that forms the self-assembling monolayer and the second molecular species is 3 alkylthiophene. The $TiO_2$ particles are dispersed in dichioromethane, and the catechol is added to the particles. A color change of the dispersion from white to light brown indicates that the monolayer has formed. The excess catechol is then washed out to obtain catechol-modified $TiO_2$. The modified $TiO_2$ particles are then mixed with 3 alkylthoiphene and the initiator for the oxidative polymerization is added. Iron (III) chloride is a suitable initiator. The mixture is stirred for about 20 hours. The remaining small molecules such as the residual initiator and any unbound polymer can be removed by washing with dichioromethane, followed by rinsing with isopropanol. Thus, only covalently-bound poly(B-alkylthiophene) remains in a surface of a particle.

The above-described embodiments of the present invention utilize $TiO_2$ particles. However, other metal oxides such as $SiO_2$, $SnO_2$, $Al_2O_3$ may also be utilized. While the present invention provides a manner of coating metal oxides, it may also be used to coat other forms of particles provided suitable self-assembling monomers can be found for the particles in question.

Various modifications to the present invention will become apparent to those skilled in the art from the foregoing description and accompanying drawings. Accordingly, the present invention is to be limited solely by the scope of the following claims.

What is claimed is:

1. A method for coating particles, said method comprising:
   suspending particles that can be coated in a self-assembling monolayer formed from a first monomer in a first solution comprising said first monomers, said first monomers forming said self-assembling monolayer on said particles thereby forming coated particles in said first solution; and
   suspending said coated particles in a second solution comprising a chemical species and an initiator for oxidative polymerization, said chemical species having a higher oxidation potential than said monomers and said chemical species forming a homopolymer in the presence of said initiator.

2. The method of claim 1 wherein said homopolymer is electroactive.

3. The method of claim 1 wherein said particles comprise a semiconductor.

4. The method of claim 1 wherein said first monomer comprises silane and said chemical species comprises 3,4 dioxyethylenethiophene.

5. The method of claim 1 wherein said first monomer comprises catechol and said chemical species comprises 3 alkylthiophene.

6. A method for coating particles, said method comprising:
   suspending said particles in a first solution comprising first monomers, said first monomers forming a self-assembling monolayer on said particles thereby forming coated particles; and
   suspending said coated particles in a second solution comprising a chemical species and an initiator for oxidative polymerization, said chemical species having a higher oxidation potential than said monomers and said chemical species forming a homopolymer in the presence of said initiator.
   wherein said semiconductor is chosen from the group consisting of $TiO_2$, $SiO_2$, $SnO_2$, and $Al_2O_3$.

7. A coated particle comprising:
   a particle coated with a layer of a first monomer surrounding said particle, said first monomers forming a self-assembling monolayer on said particles; and
   a plurality of polymer molecules covalently bound to said first monomers, said polymers comprising a homopolymer of a chemical species having a higher oxidation potential than said monomers.

8. The coated particle of claim 1 wherein said homopolymer is electroactive.

9. The coated particle of claim 7 wherein said particles comprise a semiconductor.

10. The coated particle claim 7 wherein said first monomer comprises silane and said chemical species comprises 3,4 dioxyethylenethiophene.

11. The coated particle of claim 7 wherein said first monomer comprises catechol and said chemical species comprises 3-alkylthiophene.

12. A coated particle comprising:
   a particle coated with a layer of a first monomer surrounding said particle, said first monomers forming a self-assembling monolayer on said particles; and
   a plurality of polymer molecules covalently bound to said first monomers, said polymers comprising a homopolymer of a chemical species having a higher oxidation potential than said monomers,
   wherein said semiconductor is chosen from the group consisting of $TiO_2 SiO_2$, $SnO_2$, and $Al_2O_3$.

* * * * *